United States Patent [19]
Morris et al.

[11] Patent Number: 6,020,749
[45] Date of Patent: Feb. 1, 2000

[54] METHOD AND APPARATUS FOR PERFORMING TESTING OF DOUBLE-SIDED BALL GRID ARRAY DEVICES

[75] Inventors: Terrel L. Morris, Garland; Douglas S. Ondricek, Dallas, both of Tex.

[73] Assignee: Hewlett-Packard Company, Palto Alto, Calif.

[21] Appl. No.: 08/745,531

[22] Filed: Nov. 12, 1996

[51] Int. Cl.$^7$ .................................................. G01R 31/02
[52] U.S. Cl. ........................................... 324/755; 324/765
[58] Field of Search ...................... 324/754, 755, 324/757, 758, 765, 761; 439/91, 71, 74, 68, 66; 361/66, 684, 774, 767; 174/260, 261, 250; 438/14–18

[56] References Cited

U.S. PATENT DOCUMENTS

| | | | |
|---|---|---|---|
| 5,315,241 | 5/1994 | Ewers | 324/158 R |
| 5,500,605 | 3/1996 | Chang | 324/758 |
| 5,672,965 | 9/1997 | Kurafuchi et al. | 324/757 |
| 5,716,222 | 2/1998 | Murphy | 439/91 |
| 5,731,709 | 3/1998 | Pasore et al. | 32/760 |

FOREIGN PATENT DOCUMENTS

| | | | |
|---|---|---|---|
| 0520841A1 | 12/1992 | European Pat. Off. | H01L 21/66 |
| 0721209A2 | 7/1996 | European Pat. Off. | H01L 21/66 |

OTHER PUBLICATIONS

"Customable Multi–Contact–Point Interposer", IBM Technical Disclosure Bulletin, vol. 37, No. 4B, Apr. 1, 1994, pp. 105/106, XP 000451189.

*Primary Examiner*—Vinh P. Nguyen

[57] ABSTRACT

A system and method of constructing and using a test module in situations where internal access to test points on a substrate are unavailable because devices mounted on the substrate block physical access. The test module is itself a solderable substrate and is imposed, for testing purposes, between the main substrate and the mounted devices. For double-sided or stacked main boards, two or more such modules can be used interposed between the mounted devices and the main substrate. Vias in the module serve to make contact with the test points and to carry the signals to the edge of the module where cups can be formed by cutting the edge vias in half.

18 Claims, 3 Drawing Sheets

6,020,749

METHOD AND APPARATUS FOR PERFORMING TESTING OF DOUBLE-SIDED BALL GRID ARRAY DEVICES

BACKGROUND OF THE INVENTION

The basic problem of probe testing double-sided ball grid array (BGA) devices is that the double-sided device implementation on the processor board prohibits access by an oscilloscope or other test device of the critical points of the board that require monitoring.

One known prior solution for single unit testing or de-bug testing is to partially depopulate the circuit board by removing SRAMs or other chips one side of the board. This allows access to the testing points, but since the board is only partially functional, the data from the tests on the board does not provide a true and accurate portrayal of the operations of the board. Thus, devices that are BGA mounted, and only single sided, it is possible to merely go to the backside vias and probe those vias to monitor the circuit. But on BGA devices that are double-sided, i.e., have top-side and bottom-side chip entities, there is no known way to probe that type of board while maintaining its full functionality.

Another known prior solution is directed to multi-unit testing or full production testing, and this solution is to install test points on the board. However, the test points would add stubs to the circuit which, in turn, cause reflections in the circuits. Given the number of the BGA entities on the board, and the large number of sample points for each entity, the total number of sample points would be prohibitive. The reflection resulting from the large number of stubs cause degradation in the signals. Moreover, the test points add to the cost and complexity in the manufacturing of the boards.

It is therefore desirable to design a device that would allow for de-bug testing without having to depopulate the boards and could also be used for production testing without causing the reflections in the board circuit and without introducing design changes to the board.

SUMMARY OF THE INVENTION

The above and other needs are met by a method and system that uses a printed circuit board or PCB card traces going between vias and the outer perimeter. The test board is inserted during the device manufacturing stage, or after an error has been detected for de-bugging purposes, the card is inserted so that it is positioned between the main BGA board and at least one of the surface mounted layers. The traces on the test board contact certain portions of the main board, thereby extending signals from that contacted portion to the edge of the test board. This then permits scope probe access to the outer perimeter of test board, which, if desired, could be designed slightly wider than the BGA main board.

BGA balls (usually solder) are placed on both sides of the module, securing the device (such as on SRAM) to the module and the module to the main board. Since no depopulation of parts is necessary, the main board is fully functional and the testing will provide accurate test results for de-bug analysis.

The module can be incorporated into the assembly manufacturing process. This would allow either random sampling or full lot testing of the main boards by automatic test equipment. This is particularly useful at the initial board production and when upgrades or modifications to the board are made. When the testing phase is completed, only the final assembly process has to be modified, i.e., the module is no longer installed. In prior systems where stubs were used, the removal of those stubs required changes in the board design.

In one embodiment the PCB test board is constructed using a matrix of vias with the edge vias cut in half to better accommodate a test probe.

A technical advantage of the invention is to use a PCB card as a scope probe adapter to allow testing access to the vias of the double-side BGA board.

Another technical advantage of the invention is the use of wire tracing to contact different vias to test points located on the interior of the main board from the test points on the peripheral of the test module.

A further technical advantage of the invention is the use of two modules in an over-and-under arrangement to increase the total number of vias being tested.

A still further technical advantage of the invention is to use half vias as the testing points to increase the efficiency of the test cycle.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DESCRIPTION OF THE PREFERRED EMBODIMENTS

Figure 1A:
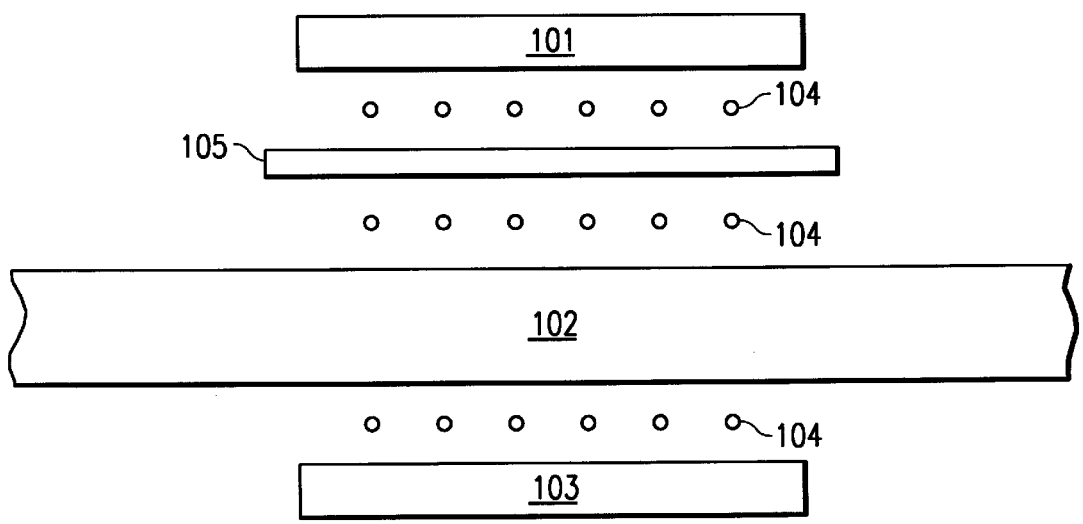
FIG. 1A depicts an exploded view of the arrangement of the inventive module on a BGA board.

FIG. 1A depicts an exploded view of a BGA board with the inventive module. The arrangement forms a sandwich which comprises top-side BGA 101, which may be a SRAM device, or other surface mounted device, a PCB board 102 and bottom-side BGA 103. BGA balls 104 are solder balls that both secure the devices together and electrically connect the devices together. Scope probe adapter 105 is inserted between the top-side BGA 101 and PCB board 102. Adapter 105 can be inserted by a technician as part of a de-bug operation for analyzing a problem with a specific board, or adapter 105 can be inserted by a machine as part of the assembly operation for production run testing. In either case, all, some or just one of the surface mounted devices can be provided with a module.

The sandwich stack shown in FIG. 1A is what defines the need for the inventive scope probe adapter module. If the stack were a single-sided board, i.e., BGA part 103 was not attached, than the probe would not be needed, the back-side vias could be probed. With the double-sided top and bottom BGA parts 101,103 mounted on a single BGA board 102, there is no probe access to the vias. Scope probe adapter 105 fits between board 102 and BGA part 101 and allows probe access to the vias. The vias in board 102 are common to both top-side part 101 and bottom-side part 103, meaning that the vias electrically connect the top part and the bottom part through PCB board 102.

Figure 1B:
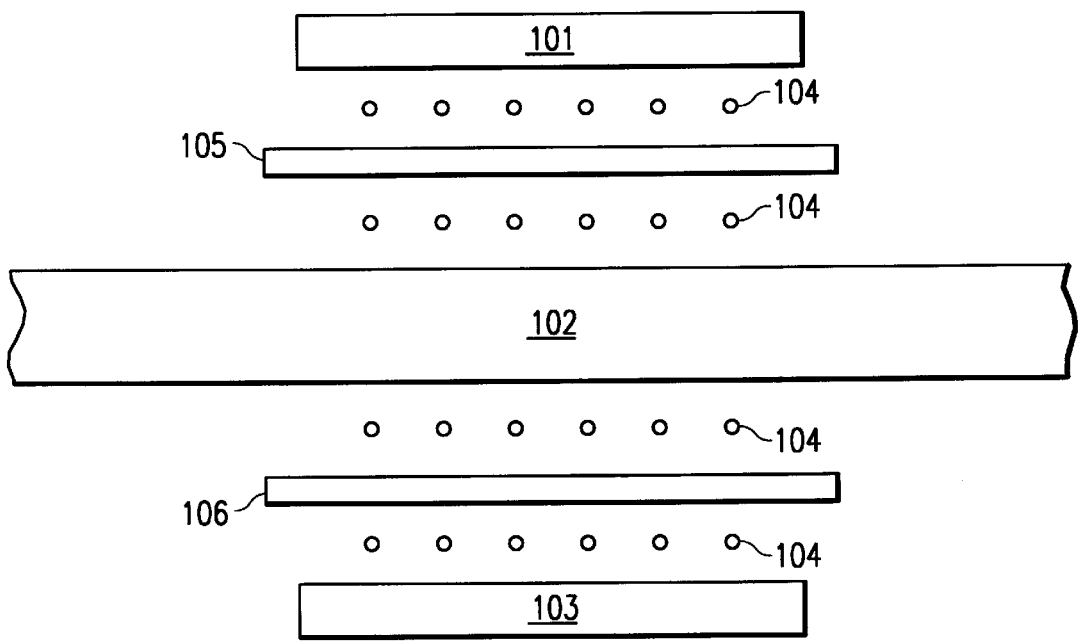
FIG. 1B is similar to FIG. 1A, and depicts an over-and-under arrangement of the inventive module.
Figure 2:
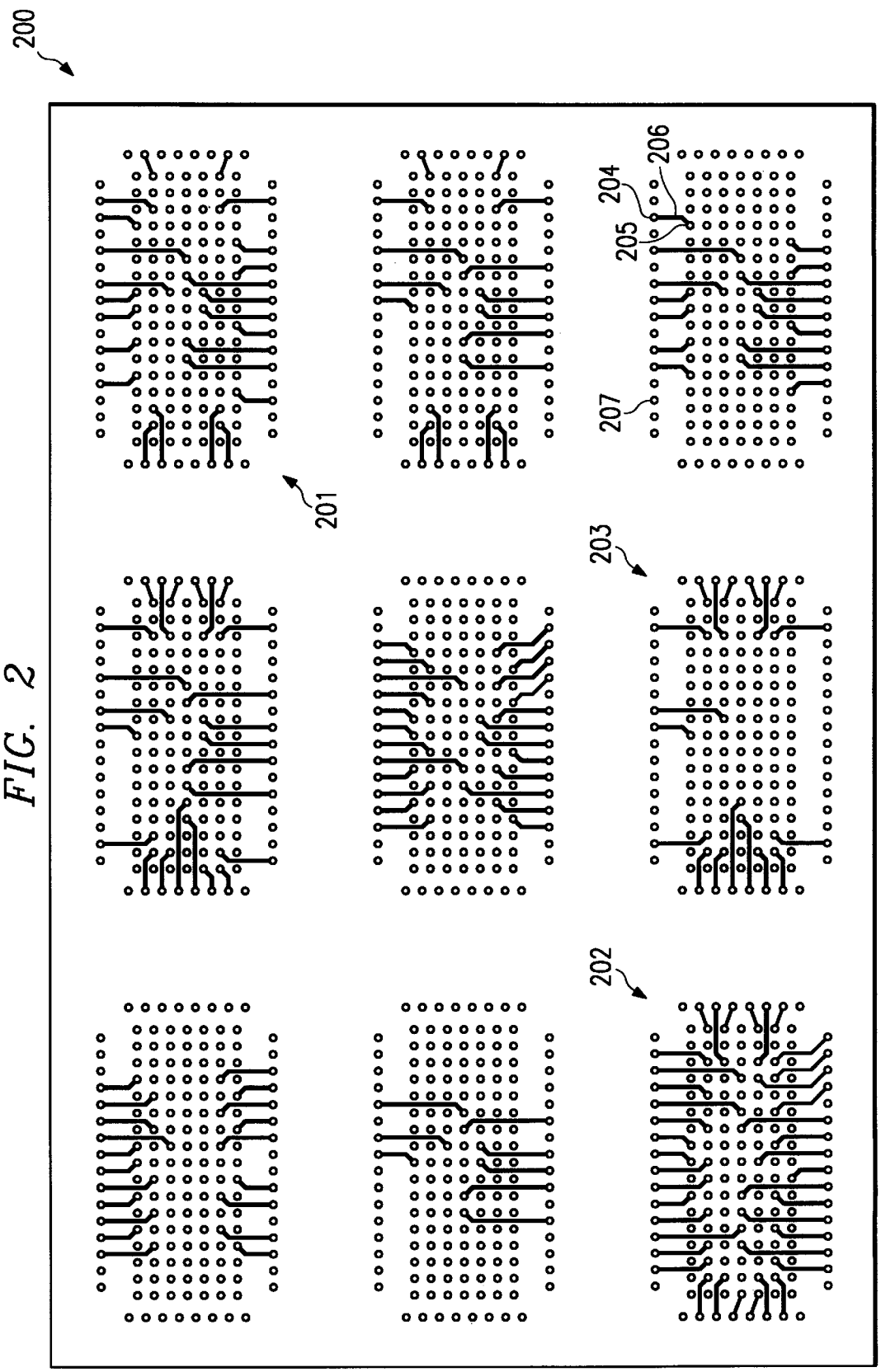
FIG. 2 depicts a card with nine inventive modules, each with a different wire trace for testing different points of functions of the BGA board and BGA device.

FIG. 2 depicts a production card having nine adapters, each for testing a different central via arrangement and shows the top art work which defines the metal that is deposited on the bare card that makes up the different scope probe adapter modules. As shown in FIG. 2, peripheral testing points 204 are the probe access points, which are connected to central vias 205 by metal trace wiring 206. The central vias interconnect the BGA parts with each other through PCB board 102. There are 48 peripheral test points and 119 central vias. Thus, there are more vias that may require testing than available test points. A solution to this problem is shown in FIG. 1B. The arrangement of FIG. 1B is similar to that of FIG. 1A, but includes a second adapter module 106, sandwiched between bottom-side BGA part 103 and PCB board 102. This doubles the number of available testing points, i.e., bottom adapter 106 can test different central vias than does top adapter 105.

Depending on the type of devices mounted to board 102, the power arrangement, the signal type, the via arrangement and density, signal linking or reflection may be a concern. Since each wire trace 206 is essentially a small stub, having numerous stubs may cause signal linking or reflections in some situations. Thus, using an adapter module with fewer trace wires, such as module 201, which will allow for testing of a specific function without signal problems. Otherwise, a module with numerous wires, such as module 202, can be used which will allow for testing of a plurality of functions. In operation, the probe board can be different for each phase of testing and can be used in any order desired.

Figure 3:
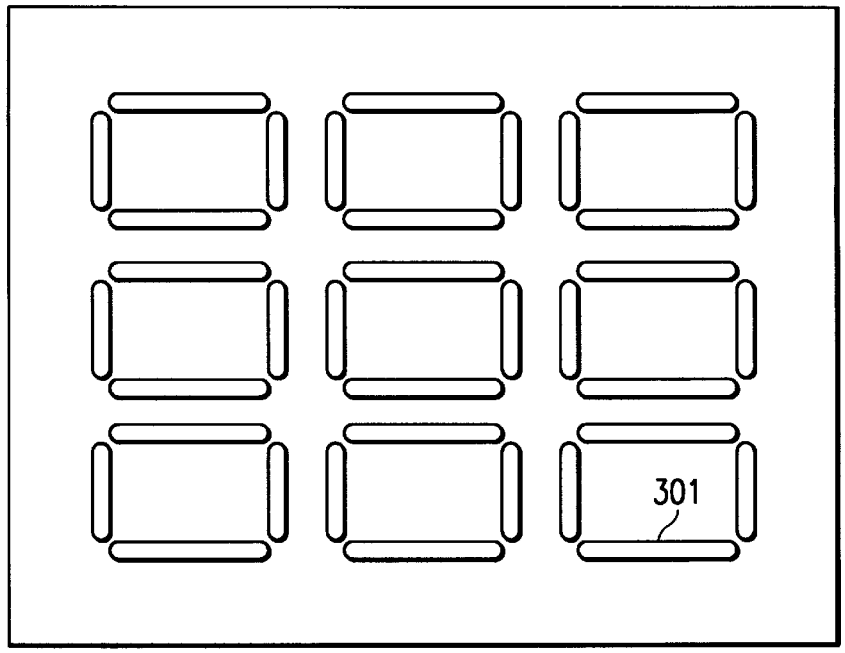
FIG. 3 depicts the cutout pattern used to cut the nine inventive modules of FIG. 2.

Another feature of the invention is the formation of set of testing pads 402 (FIG. 4), each of which forms a little cup to catch the end of a scope probe. The cup makes it easier and faster to align the probe with the testing point. The cup is formed by cutting a peripheral via in half. FIG. 3 depicts a cutting pattern 301 for making the peripheral via cuts in the adapter module production card of FIG. 2. Overlaying pattern diagram 300 of FIG. 3 with module card 200 of FIG. 2 shows one method of cutting in such a way that the cuts pass through the center of the peripheral vias 204 and 207, thus forming half vias.

Figure 4:
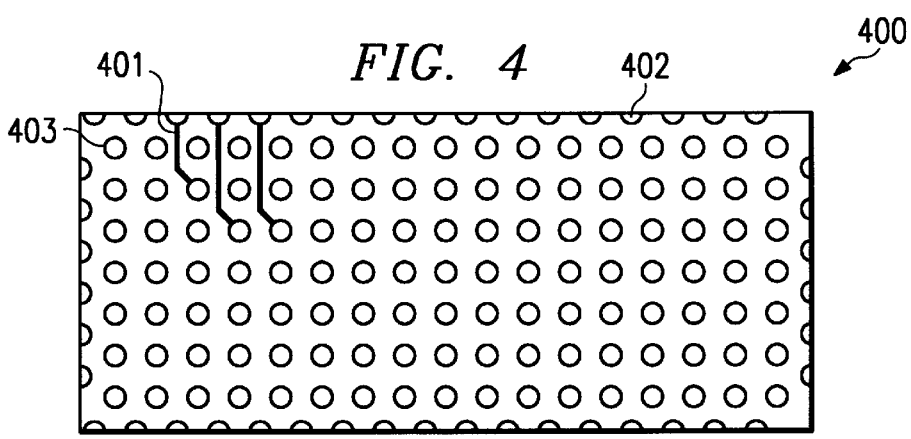
FIG. 4 depicts a cutout inventive module with half vias at the edges for use as test points.

FIG. 4 depicts a finished adapter module, separated from the production card with the peripheral test points comprising half vias 402, with metal wires 401 connecting vias to the test points.

The module will perform with manual test operations, which could test signal at selected points on the main board or on the mounted module. The adapter allows the individual monitoring of signals with a high frequency oscilloscope for de-bugging purposes. The module is approximately twenty (20) mils. wider or about 15 to 25 mils wider than the device that it services. If the module was made wider than this, the hot air equipment would not properly solder the balls for the ball grid array. This is because the added width would tend to reduce the temperature of the hot air resulting in poor reflow of the solder balls in the center of the device. Making the module only slightly larger than the device it is testing will allow the automatic test machine easier access to the test points while still allowing for proper solder flow. The module can be extended to a wider width for automatic tests, but this would require corresponding changes in the setting of the hot air equipment. The module can be removed from the circuit board once the testing is completed, or the board may be shipped with the test module left in place.

Figure 5A:
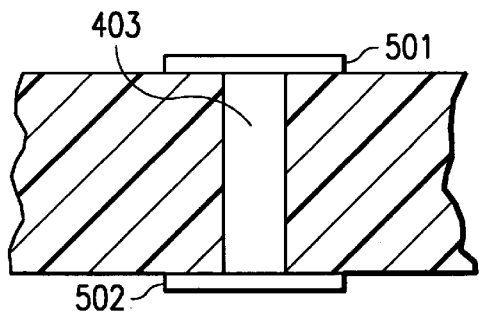
FIG. 5A shows the typical dimensions of module inner via.
Figure 5B:
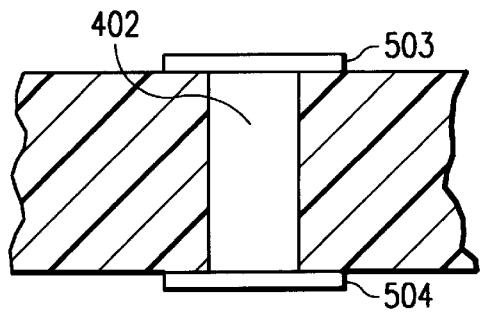
FIG. 5B shows the improved dimensions of a module edge via.

FIG. 5A shows an inner via 403 typically being about 0.008" in diameter and FIG. 5B shows perimeter via being about 0.012" in diameter. The thickness of the test module would typically be 0.032". In the embodiment shown, the vias would be plated solid so as to pass electrical signals and would have pad 501, 502, 503, 504 on the top and bottom surfaces so as to contact with both the main board and with a mounted device. Note, that if the via is too large, then during solder reflow operations solder will be wicked through the capillary formed by the via.

Although the present invention and its advantages have been described in detail, it should be understood that various changes, substitutions and alterations can be made herein without departing from the spirit and scope of the invention as defined by the appended claims. For example, the printed wire board test module can be constructed from any material and the signal connectivity need not be wire or copper, but could be light passages or be the passage of any type of signal to be measured. Also, for stacked or layered devices, several test modules could be used if desired, one between each layer of devices.

What is claimed is:

1. A test adapter module for providing access to a device that is to be connected to a substrate, wherein the substrate has points which are to be electrically connected to corresponding points on the device, and the points of the substrate and the points of the device have a common pattern, the module comprising:

a plurality of adapter vias arranged in the common pattern;

a plurality of test point vias arranged around a periphery of the adapter vias; and a plurality of signal paths connecting at least some of the test point vias with selected adapter vias;

wherein the test point vias are adapter vias where each have been cut approximately in half to form a catch portion for receiving and aligning a testing probe; and the module is to be located between the device and the substrate, and the adapter vias of the module are to electrically connect the points of the substrate and the corresponding points of the device.

2. The test adapter module of claim 1, wherein:

the test point vias have a larger diameter than the adapter vias.

3. The test adapter module of claim 1, wherein:

a dimension of the adapter module is approximately 20 mils greater than a corresponding dimension of the device.

4. The test adapter module of claim 1, wherein:

a dimension of the adapter module is the range of about 15 to 25 mils greater than a corresponding dimension of the device.

5. The test adapter module of claim 1, wherein:

the substrate has at least two devices connected thereto, with at least one device connected to one side of the substrate and at least one device connected to the other side of the substrate, and the substrate has vias thereon; and the adapter module is to be located between one of the devices and the substrate, whereby the pattern of adapter vias is aligned with the pattern of the substrate points.

6. The test adapter module of claim 5, wherein:

the adapter module is to be located as part of a manufacturing process of the board.

7. The test adapter module of claim 5, wherein:

the adapter module is to be located as part of a diagnostic operation being performed on the substrate.

8. The test adapter module of claim 5, wherein:

the adapter module is to be secured to said one device and the substrate by BGA solder balls.

9. The test adapter module of claim 5, further comprising:

another adapter module that is to be located between the other of the two devices and the substrate.

10. The test adapter module of claim 9, wherein:

said another adapter module has a plurality of adapter vias arranged in the common pattern, whereby a corresponding via of the adapter module is to be electrically connected to a corresponding via of said another adapter module;

said another adapter module has a plurality of test point vias arranged around a periphery of the adapter vias; and said another adapter module has a plurality of signal paths connecting at least some of the test point vias with selected adapter vias that are different in location than the adapter vias of the adapter module.

11. The test adapter of claim 1, wherein:

each via of the plurality of vias has a predetermined diameter that is selected to prevent solder capillary action.

12. The test adapter of claim 1, wherein:

the device is a BGA device.

13. A pair of test adapter modules for providing access to two BGA devices that are to be connected to a substrate, with one device connected to one side of the substrate and the other device connected to the other side of the substrate, wherein the substrate has points which are to electrically connect to corresponding points of each of the two BGA devices, each adapter module comprising:

a plurality of adapter vias arranged in a pattern that corresponds to a pattern of electrical points on the substrate;

a plurality of test point vias arranged around a periphery of the adapter vias; and a plurality of signal paths connecting at least some of the test point vias with selected adapter vias;

wherein the signal paths connect the test point vias of each adapter module to selected adapter vias corresponding to different locations in the pattern;

the test point vias are adapter vias where each have been cut approximately in half to form a catch portion for receiving and aligning a testing probe;

one adapter module is to be located between the one device and the substrate and the adapter vias of the one module are to electrically connect the points of the substrate, and the corresponding points of the one device; and the other adapter module is to be located between the other device and the substrate, and the adapter vias of the other module are to electrically connect the points of the substrate and the corresponding points of the other device.

14. A system that provides access for testing to a device that is connected to a substrate, wherein the substrate has points which are electrically connected to corresponding points on the device, and the points of the substrate and the points of the device have a common pattern, the system comprising:

a test adapter module that includes:

a plurality of adapter vias arranged in the common pattern;

a plurality of test point vias arranged around a periphery of the adapter vias; and a plurality of signal paths connecting at least some of the test point vias with selected adapter vias;

wherein the test point vias are adapter vias where each have been cut approximately in half to form a catch portion for receiving and aligning a testing probe; and the module is located between the device and the substrate, and the adapter vias of the module electrically connect the points of the substrate and the corresponding points of the device.

15. The system of claim 14, wherein:

the substrate has at least two devices connected thereto, with at least one device connected to one side of the substrate and at least another device connected to the other side of the substrate, and the substrate has vias thereon; and the adapter module is connected between the one device and the substrate, whereby the pattern of adapter vias is aligned with the pattern of the substrate points.

16. The system of claim 15, further comprising:

another adapter module that is connected between the another device and the substrate.

17. The system of claim 16, wherein:

said another adapter module has a plurality of adapter vias arranged in the common pattern, whereby a corresponding via of the adapter module is electrically connected to a corresponding via of said another adapter module;

said another adapter module has a plurality of test points arranged around a periphery of the adapter vias; and said another adapter module has a plurality of signal paths connecting at least some of the test points with selected adapter vias that are different in location than the adapter vias of the adapter module.

18. The system of claim 14, wherein:

the device is a BGA device.

* * * * *